(12) United States Patent
Wiza et al.

(10) Patent No.: US 10,310,038 B2
(45) Date of Patent: Jun. 4, 2019

(54) SYSTEM AND METHOD FOR SUPPLYING ELECTRICAL POWER TO A GRADIENT AMPLIFIER

(71) Applicant: GENERAL ELECTRIC COMPANY, Schenectady, NY (US)

(72) Inventors: Margaret Ann Wiza, New Berlin, WI (US); Melissa Jean Freeman, Oconomowoc, WI (US); Syed Saad Asif Ali, Brookfield, WI (US); Douglas John Link, Lake Mills, WI (US); Michael Thomas Rose, Wauwatosa, WI (US); Tanzania Samone Sewell, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 348 days.

(21) Appl. No.: 15/163,193

(22) Filed: May 24, 2016

(65) Prior Publication Data

US 2017/0343630 A1 Nov. 30, 2017

(51) Int. Cl.
 *G01R 33/385* (2006.01)
(52) U.S. Cl.
 CPC .............................. *G01R 33/3852* (2013.01)
(58) Field of Classification Search
 USPC ................................................. 324/300–322
 See application file for complete search history.

(56) References Cited

U.S. PATENT DOCUMENTS 7,847,531 B2 12/2010 Qiu et al.
8,059,430 B2 11/2011 Osaka
8,253,395 B2 8/2012 Irissou et al.
RE44,587 E 11/2013 Qiu et al.
8,599,589 B2 12/2013 Lum
8,933,677 B2 1/2015 Wickersham et al.
8,971,073 B2 3/2015 Grant et al.
2010/0244840 A1 9/2010 McKinnon
2010/0271026 A1* 10/2010 Amm .................. G01R 33/385
324/318

(Continued)

FOREIGN PATENT DOCUMENTS

JP 2016010598 A 1/2016
WO WO2014042691 A1 3/2014

OTHER PUBLICATIONS

International Search Report and Written Opinion for International Application No. PCT/US2017/034225, dated Jul. 24, 2017. 12 pages.

*Primary Examiner* — Patrick Assouad
*Assistant Examiner* — Demetrius R Pretlow
(74) *Attorney, Agent, or Firm* — Grogan, Tuccillo & Vanderleeden, LLP

(57) ABSTRACT

A method for supplying electrical power to a gradient amplifier that drives a gradient coil for a magnetic resonance imaging system is provided. The method includes predicting a gradient voltage required to drive the gradient coil for a scan based at least in part on a gradient coil model. The method further includes calculating a voltage set point for a power supply based at least in part on the predicted gradient voltage. The method further includes providing electrical power to the gradient amplifier via the power supply based at least in part on the calculated voltage set point. The gradient coil model is based at least in part on historical data acquired prior to the scan.

17 Claims, 5 Drawing Sheets

(56) References Cited

U.S. PATENT DOCUMENTS

| | | | |
|---|---|---|---|
| 2012/0007571 A1* | 1/2012 | Huisman | G01R 33/3852 323/271 |
| 2012/0153952 A1* | 6/2012 | Lechner | G01R 33/56572 324/314 |
| 2012/0176131 A1* | 7/2012 | Madhuranthakam | G01R 33/4828 324/307 |
| 2014/0122004 A1 | 5/2014 | Asaba | |
| 2015/0048826 A1 | 2/2015 | Hori, I et al. | |
| 2016/0077173 A1* | 3/2016 | Juloski | G01R 33/3852 324/307 |
| 2016/0091582 A1* | 3/2016 | Thompson | G01R 33/56518 324/309 |
| 2017/0160358 A1* | 6/2017 | Miura | G01R 33/3852 |
| 2017/0176555 A1* | 6/2017 | Kawajiri | G01R 33/3875 |

* cited by examiner

SYSTEM AND METHOD FOR SUPPLYING ELECTRICAL POWER TO A GRADIENT AMPLIFIER

BACKGROUND

Technical Field

Embodiments of the invention relate generally to superconducting magnets and, more specifically, to a system and method for supplying electrical power to a gradient amplifier.

Discussion of Art

Magnetic resonance imaging ("MRI") is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to impose a strong main magnetic field on the nuclei in the object to be imaged. The nuclei are excited by a radio frequency ("RF") signal at characteristics NMR (Larmor) frequencies. By spatially disturbing localized magnetic fields surrounding the object and analyzing the resulting RF responses from the nuclei as the excited protons relax back to their lower energy normal state, a map or image of these nuclei responses as a function of their spatial location is generated and displayed. An image of the nuclei responses provides a non-invasive view of an object's internal structure.

Many MRIs utilize gradient amplifiers to drive gradient coils that produce magnetic field gradients for spatially encoding acquired signals embedded within an RF response. In such MRIs, the gradient amplifiers often generate gradient signals/waveforms by modulating a power input voltage via switching electronic topologies. As it happens to be, many gradient amplifiers utilize switching devices, also referred to herein as "switches", e.g., metal-oxide-semiconductor field-effect transistors ("MOSFETs") and/or insulated gate bipolar transistors ("IGBTs"), in their topologies. Such switches, however, often experience two types of power losses, namely, conduction loss and switching loss. Conduction loss occurs while a switch is in a closed state, e.g., a physical state in which electrical current flows through the switch, as opposed to an opened state, e.g., a physical state wherein electrical current cannot flow through the switch. Switching loss occurs during the amount of time it takes for a switch to change physical states, e.g., from closed to opened and/or from opened to closed. In many gradient amplifiers, the total amount of electrical power lost by the gradient amplifier over a given period of time may be estimated by summing the conduction and switching losses of the switches utilized by the gradient amplifier.

Accordingly, in order to properly drive a gradient coil, many gradient amplifiers require a supply of power that is larger than would otherwise be required in the absence of conduction and switching losses. The increased magnitude of the supply power, however, increases the operational costs of the MRI and increases the amount of heat generated by the gradient amplifier.

What is needed, therefore, is an improved system and method for supplying electrical power to a gradient amplifier that reduces the magnitude of the supplied power.

BRIEF DESCRIPTION

In an embodiment, a method for supplying electrical power to a gradient amplifier that drives a gradient coil for a magnetic resonance imaging system is provided. The method includes predicting a gradient voltage required to drive the gradient coil for a scan based at least in part on a gradient coil model. The method further includes calculating a voltage set point for a power supply based at least in part on the predicted gradient voltage. The method further includes providing electrical power to the gradient amplifier via the power supply based at least in part on the calculated voltage set point. The gradient coil model is based at least in part on historical data acquired prior to the scan.

In another embodiment, a gradient driver for a magnetic resonance imaging system is provided. The gradient driver includes a gradient amplifier and a controller. The gradient amplifier is configured to drive a gradient coil in the magnetic resonance imaging system. The controller is configured to electronically communicate with a power supply that provides electrical power to the gradient amplifier based at least in part on a voltage set point, and to calculate the voltage set point based at least in part on a gradient voltage required to drive the gradient coil for a scan. The controller is further configured to predict the gradient voltage based at least in part on a gradient coil model derived from historical data.

In yet another embodiment, a magnetic resonance imaging system is provided. The magnetic resonance imaging system includes a magnet assembly, a gradient amplifier, a power supply, and an MRI controller. The magnet assembly includes a gradient coil. The gradient amplifier is configured to drive the gradient coil. The power supply is configured to provide electrical power to the gradient amplifier based at least in part on a voltage set point. The MRI controller is configured to electronically communicate with the power supply and to calculate the voltage set point based at least in part on a gradient voltage required to drive the gradient coil for a scan. The MRI controller is further configured to predict the gradient voltage based at least in part on a gradient coil model derived from historical data.

DRAWINGS

The present invention will be better understood from reading the following description of non-limiting embodiments, with reference to the attached drawings, wherein below:

DETAILED DESCRIPTION

Figure 1:
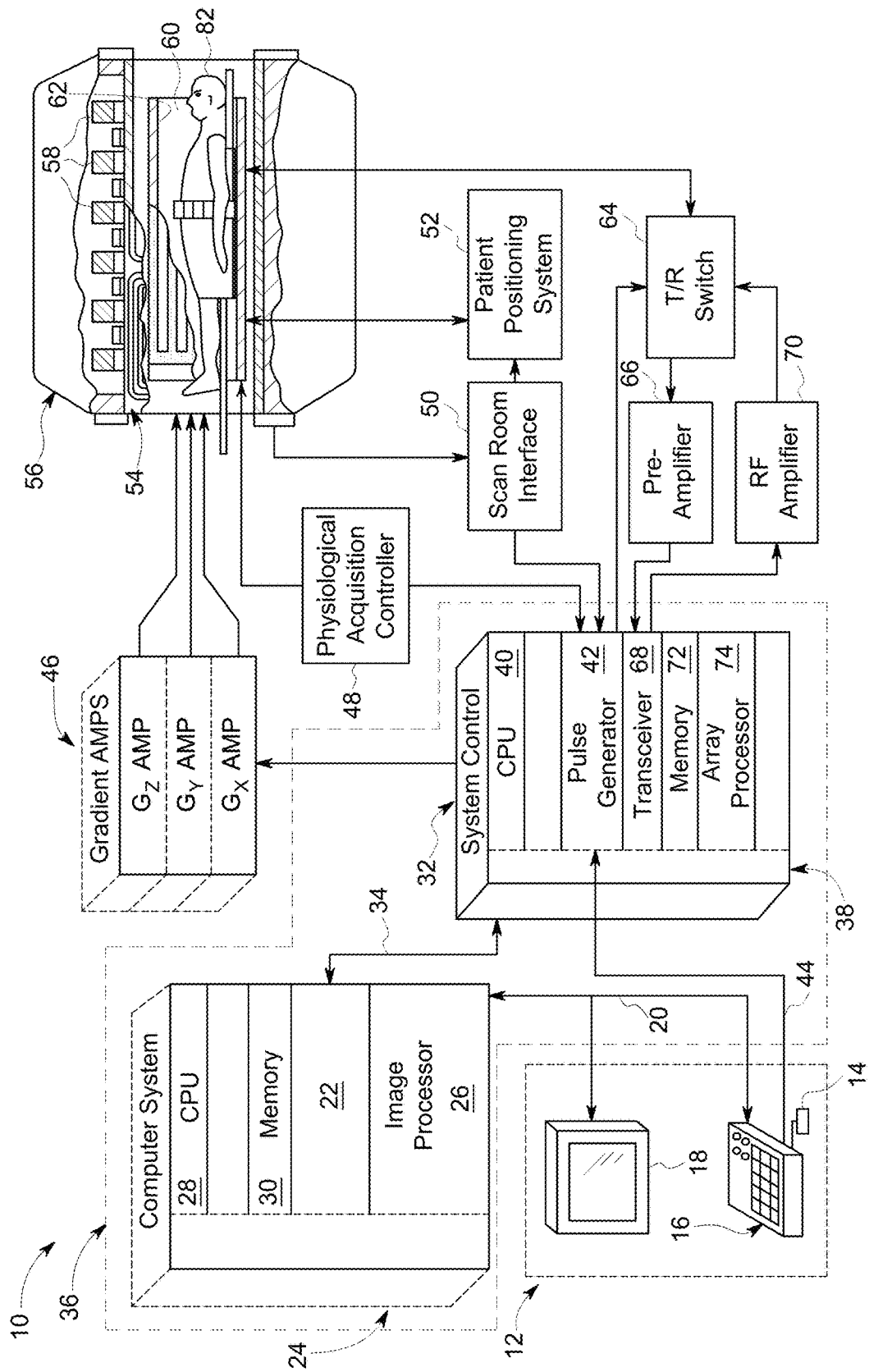
FIG. 1 is a block diagram of an exemplary MRI system that includes one or more gradient amplifiers in accordance with an embodiment of the invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled", "electrically connected", and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present.

Further, while the embodiments disclosed herein are described with respect to an MRI system, it is to be understood that embodiments of the present invention may be applicable to other imaging systems, and/or other devices that utilize an electrical amplifier to modulate an electrical signal Further still, as will be appreciated, embodiments of the present invention related imaging systems may be used to analyze animal tissue, and tissue motion generally, and are not limited to human tissue and blood flow.

Referring to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly/gradient coils 54 form part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space data has been acquired in the memory module 72. This raw k-space data is rearranged into separate k-space data arrays for each image to be reconstructed, and each of these is input to an array processor 74 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Figure 2:
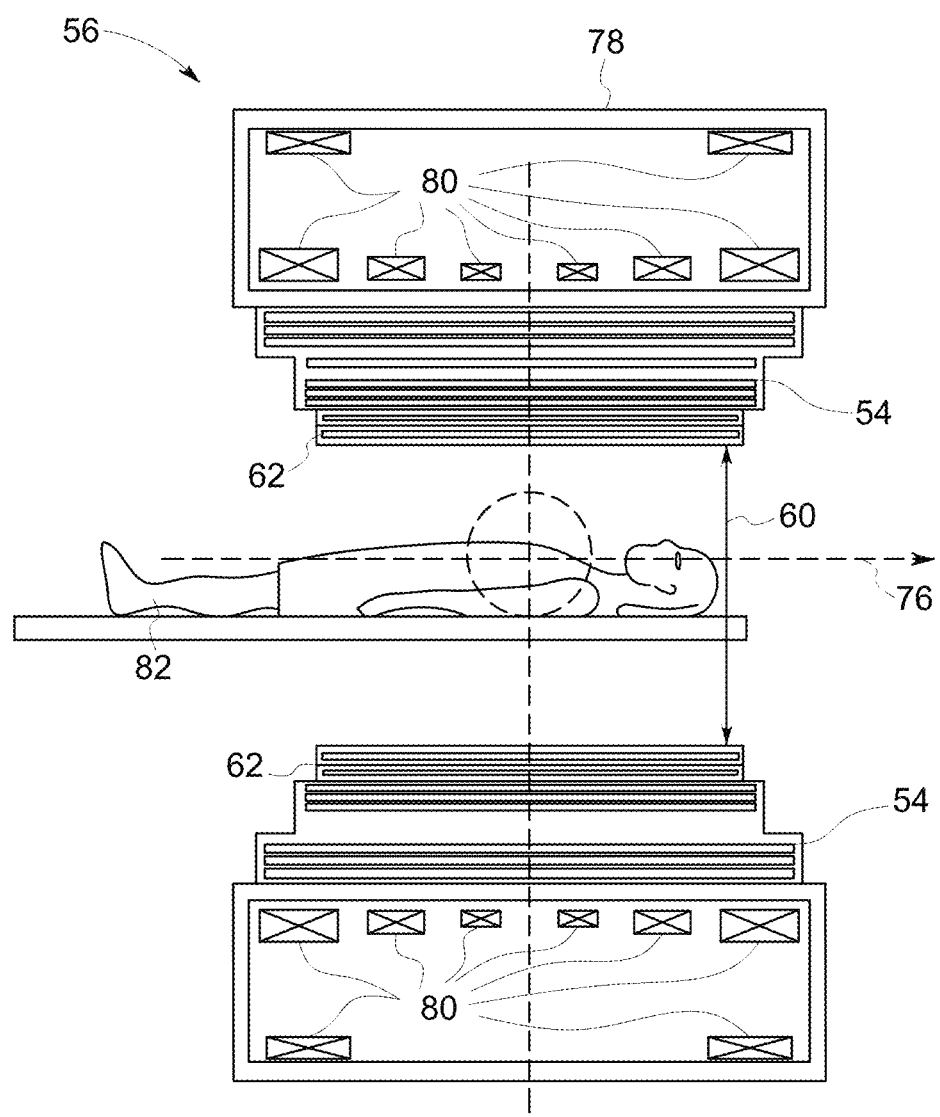
FIG. 2 is a schematic cross-sectional view of a magnet assembly of the MRI system of FIG. 1.

Moving to FIG. 2, a schematic side elevation view of the magnet assembly 56 in accordance with an embodiment of the invention is shown. The magnet assembly 56 is cylindrical in shape having a center axis 76. The magnet assembly 56 includes a cryostat 78 and one or more radially aligned longitudinally spaced apart superconductive coils 80. The superconductive coils 80 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 78 in order to help insulate the cryostat 78 from heat generated by the rest of the MRI system (10 in FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 82 is inserted into the magnet assembly 56.

Figure 3:
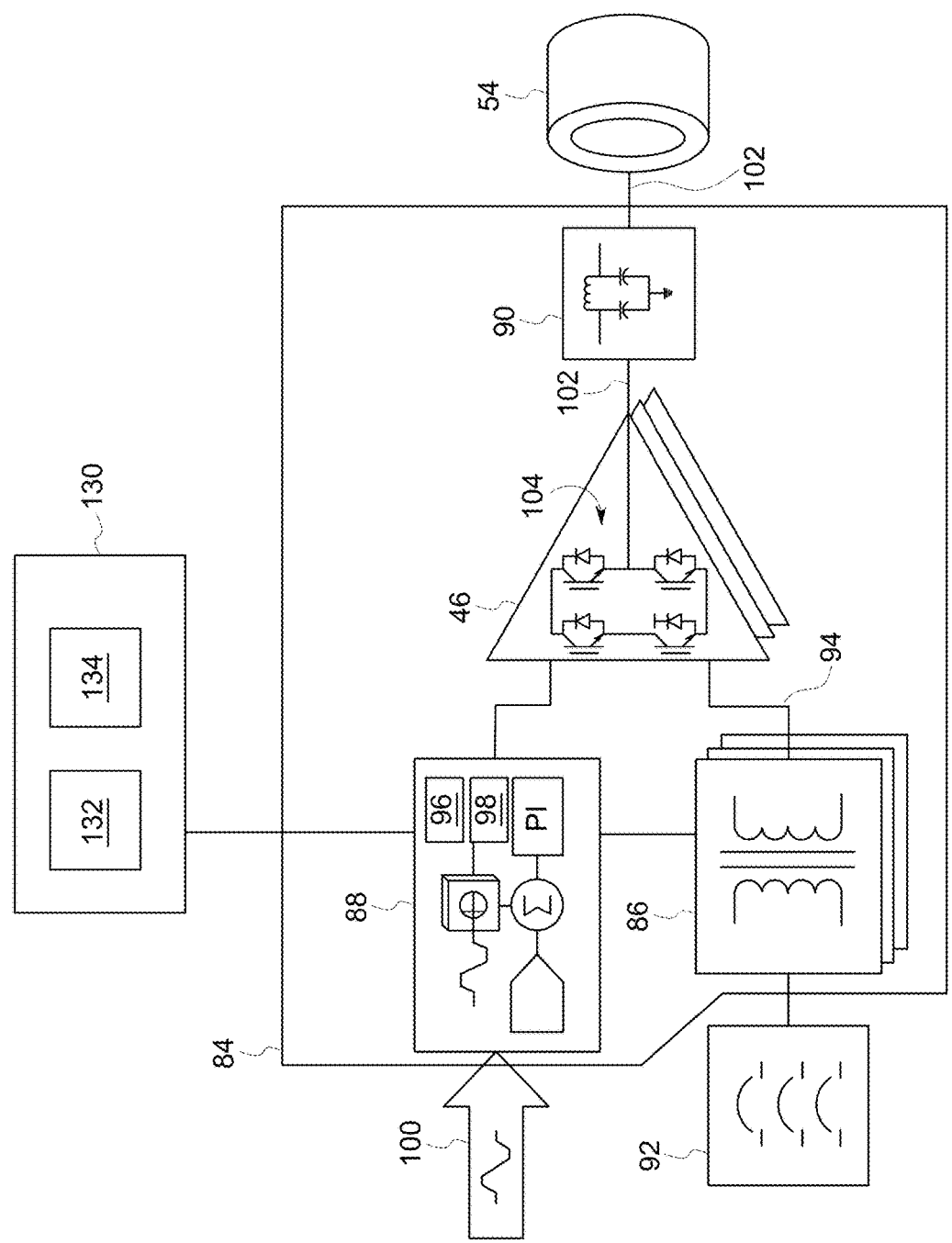
FIG. 3 is a block diagram of a gradient driver that includes a gradient amplifier representative of the one or more gradient amplifiers of FIG. 1 in accordance with an embodiment of the invention.

Turning now to FIG. 3, in embodiments, one or more of the gradient amplifiers Gz, Gy, and/or Gx (shown collectively as 46 in FIG. 1 and represented individually as 46 in FIG. 3) may be incorporated/included into a gradient driver/system 84 that additionally includes a power supply 86, an amp-controller 88, and/or a gradient filter 90. While FIG. 3 depicts a single gradient amplifier 46 incorporated into a single gradient driver 84, it is to be understood that, in embodiments, two or more gradient amplifiers 46 may be incorporated into a single driver 84. Moreover, in embodiments, the various components of the gradient driver 84, e.g., the power supply 86, the amp-controller 88, gradient amplifier 46, and/or the gradient filter 90 may be incorporated into the MRI system 10 without necessarily forming a physical/unified driver 84, i.e., the components of the driver 84 may be distributed within various components of the MRI system 10.

As shown in FIG. 3, the power supply 86 is configured to receive electrical power from the power distribution system 92 and to output/provide a power input voltage 94, i.e., electrical power, to the gradient amplifier 46. As will be appreciated, in embodiments, the power supply 86 may include a step up and/or a step down transformer, and/or other appropriate devices for conditioning the electrical power received from the power distribution system 92 so as to provide the power input voltage 94

The amp-controller 88 may include at least one processor/CPU 96 and/or a memory device 98 that stores a gradient driver application, and may be configured to electronically communicate with the amplifier 46, the power supply 86, and/or the MRI controller 36. For example, in embodiments, the amp-controller 88 may serve as the interface between the gradient driver 84 and the MRI controller 36 and/or may be incorporated into the MRI controller 36. As will be appreciated, the amp-controller 88 may control the operation of the amplifier 46 and/or the power supply 86 based upon a control signal 100 received from the MRI controller 36 via the pulse generator 42.

The gradient amplifier 46 may be electronically connected to the amp-controller 88 and the power supply 86 such that the amp-controller 88 directs the gradient amplifier 46 to modulate the power input voltage 94 so as to produce a gradient power signal/current waveform, also referred to herein as the Pulse Sequence Description ("PSD") 102, that drives a gradient coil 54. As shown in FIG. 3, the PSD 102 may be cleaned by passing through the gradient filter 90 prior to reaching the gradient coil 54.

In embodiments, the gradient amplifier 46 may modulate the power input voltage 94 via a switching topology. Accordingly, in such embodiments, the gradient amplifier 46 may include one or more switches 104, e.g., MOSFETs, IGBTs, and/or other similar electronic switching devices. Thus, the gradient amplifier 46 may experience both conduction and switching losses as shown in FIG. 4.

Figure 4:
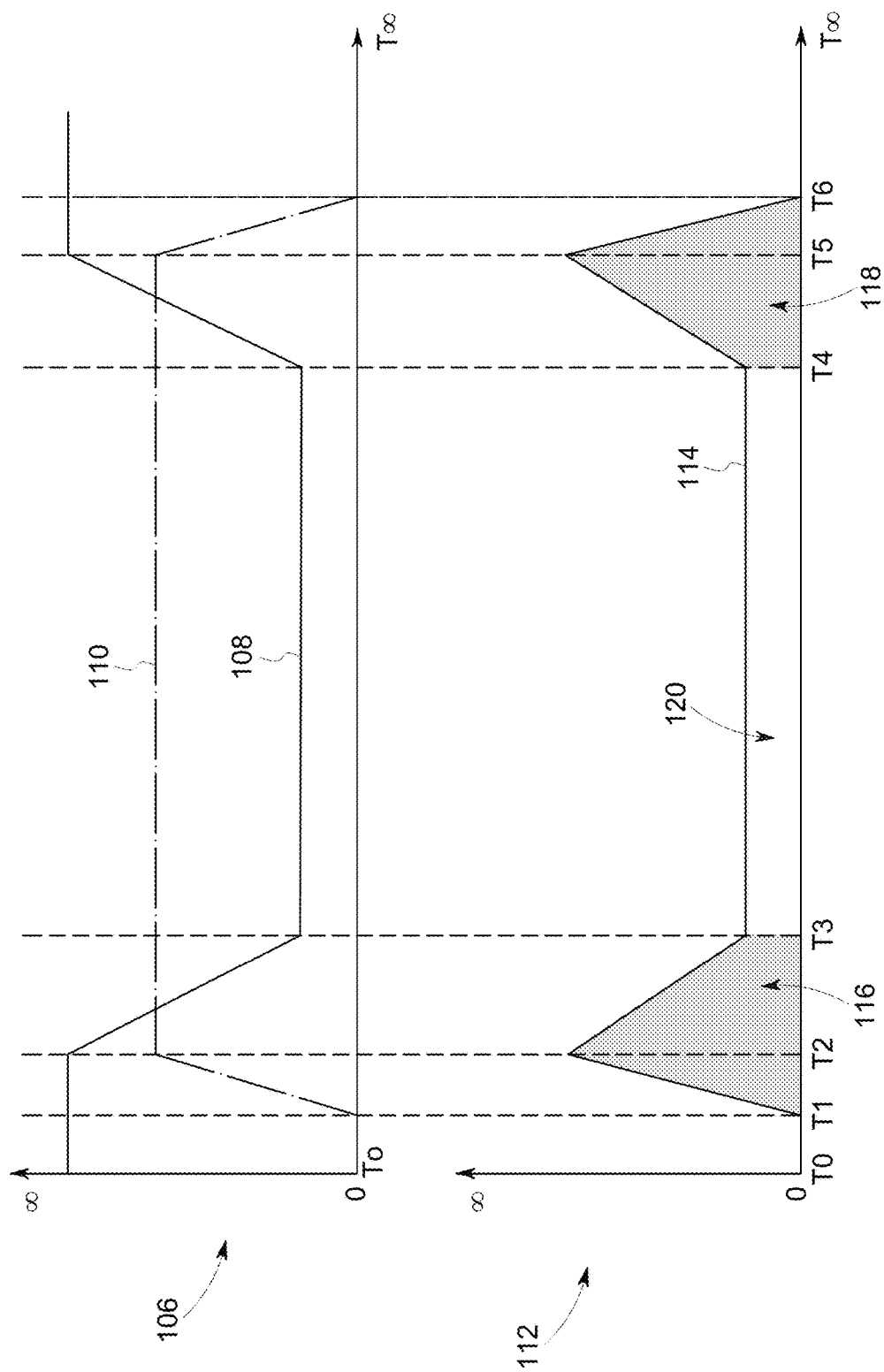
FIG. 4 is a graphical chart that depicts switching and conduction power losses in the one or more gradient amplifiers of FIG. 1.

In particular, the chart in FIG. 4 includes a first region 106 that depicts the voltage and current within one of the switches 104 as lines 108 and 110, respectively, over a switching cycle from $T_0$ (the beginning of the cycle) to $T_\infty$ (the end of the cycle); and a second region 112 that depicts power loss within the switch 104 contained in the gradient amplifier 46 as line 114 over the same switching cycle $T_0$ to $T_\infty$. For example, as shown in FIG. 4, at time $T_0$, the switch 104 may be in a open state wherein no current 110 passes through the switch 104 and the voltage 108 within the switch 104 is stabilized at an elevated level. At $T_1$, the switch 104 begins a first transition from the open state to a closed state. As the first transition proceeds, the current 110 begins to flow through the switch 104 while the voltage 108 remains elevated. A maximum power loss may occur at $T_2$, whereupon the voltage 108 beings to drop and the current 110 stabilizes at an elevated level. The voltage 108 continues to drop until stabilizing at a lower level at $T_3$, thus signaling that the switch 104 has stabilized in the closed state.

Conversely, at $T_4$, the switch 104 begins a second transition from the closed state back to the open state whereupon the voltage 108 begins to increase while the current 110 remains stable at the elevated level. As also shown in FIG. 4, a maximum power loss for the second transition may occur at $T_5$, whereupon the current 110 begins to drop while the voltage 108 stabilizes at the elevated level. The current 110 continues to drop until $T_6$ where it reaches the same level it was at $T_0$, e.g., zero or near zero amps, signaling that the switch 104 has stabilized in the open state. Accordingly, the switching losses for both the first transition $T_1$-$T_3$, the second transition $T_4$-$T_6$, and the conduction loss between the transitions are depicted as areas 116, 118, and 120, respectively, under the power loss line 114. Additionally, and as will be appreciated, the magnitude of the switching power losses 116 and 118 may be proportional to the magnitude of the power input voltage 94.

Figure 5:
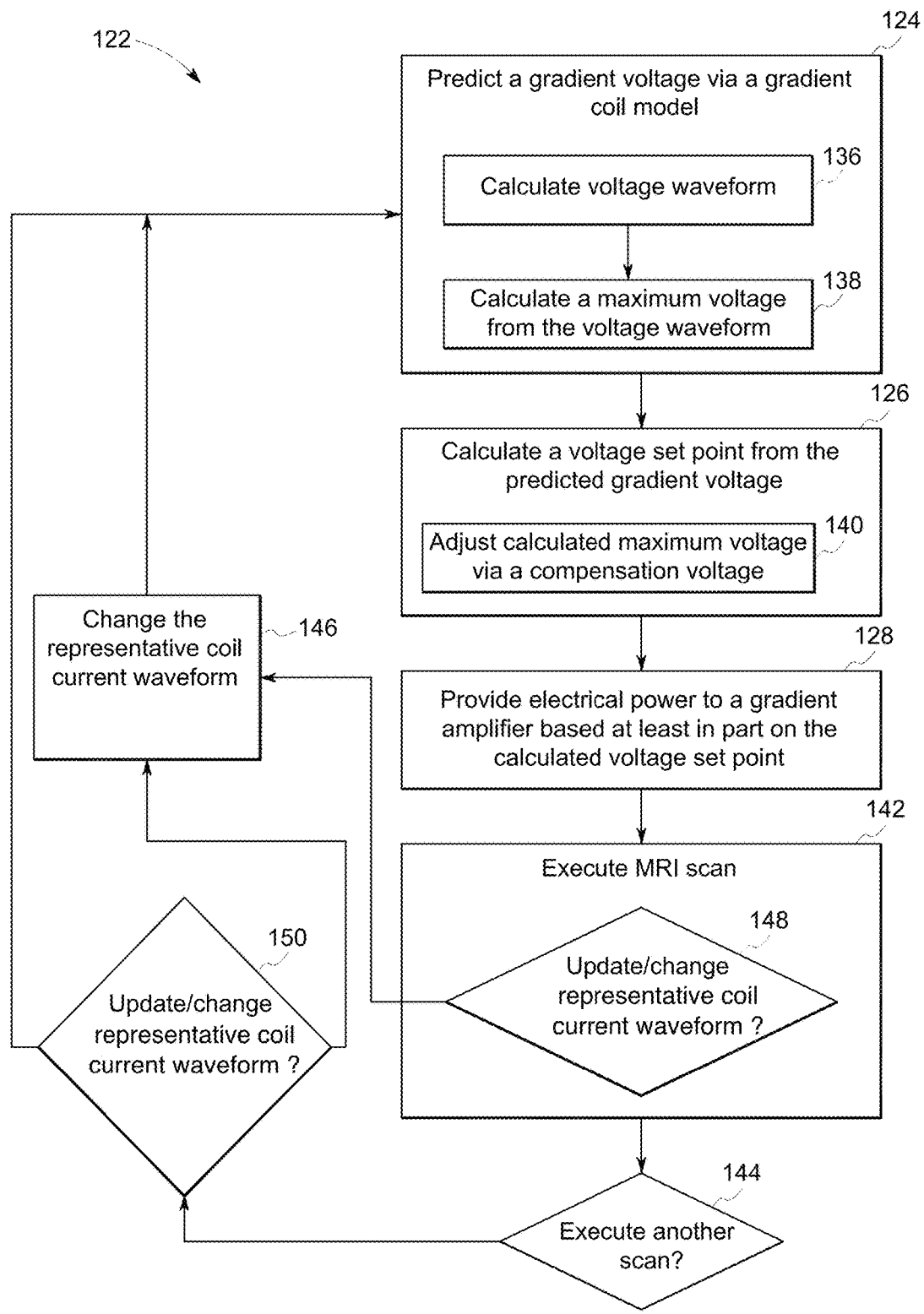
FIG. 5 is a flow chart depicting a method for supplying electrical power to the one or more gradient amplifiers of FIG. 1 utilizing the gradient driver of FIG. 3 in accordance with an embodiment of the invention.

Referring now to FIG. 5, a method 122 for supplying electrical power, e.g., the power input voltage 94, to the gradient amplifier 46 utilizing the gradient driver 84 in accordance with an embodiment of the invention is shown. As will be appreciated, in certain embodiments, the gradient driver application stored in the memory device 98 may be loaded into the CPU 96 such that the amp-controller 88 is adapted by the gradient driver application to perform all, or part, of method 122. Accordingly, as shown in FIG. 5, the method 122 includes predicting 124 a gradient voltage required to drive the gradient coil 54 for a scan based at least in part on a gradient coil model; calculating 126 a voltage set point $V_{set\ point}$ for the power supply 86 based at least in part on the predicted gradient voltage; and providing 128 electrical power to the gradient amplifier 46 via the power supply 86 based at least in part on the calculated 126 voltage set point. As is to be understood, in embodiments, $V_{set\ point}$ is a target voltage that the power supply 86 may seek to output/provide 128 for the power input voltage 94.

In embodiments, the predicted gradient voltage may be a voltage required to generate the PSD 102, i.e., a voltage sufficient to generate a current waveform required to drive the gradient coil 54 during a MRI scan sequence. For example, in embodiments, the MRI system 10 may be capable of performing various types of scans, wherein each scan has a specific PSD 102 for each of the gradient coils 54 that includes a voltage waveform and a current waveform. In such embodiments, the MRI controller 36 may communicate the specific scan intended to be executed by the MRI system 10 to the amp-controller 88 which in turn utilizes the gradient coil model to predict 124 the gradient voltage required to satisfy the PSD 102 for the specified scan. For example, in embodiments, the gradient voltage may be based at least in part on the voltage waveform $V_{coil}$ of the PSD 102, wherein the voltage waveform $V_{coil}$ may be derived via applying the gradient coil model $Z_{coil}$ to a representative coil current waveform $I_{coil}$, e.g., $V_{coil}=I_{coil}*Z_{coil}$.

As will be appreciated, $I_{coil}$ may be specific to a particular scan/PSD 102 and may be a known input by design.

As will be further appreciated, in embodiments, $Z_{coil}$ may be derived/based at least in part on historical data stored in a historical data base (130 in FIG. 3) which may be in electronic communication with the MRI system 10 via the MRI controller 36, the amp-controller 88, and/or other suitable electronic communication devices which may be integrated into the MRI system 10.

The historical database 130 may include at least one processor/CPU (132 in FIG. 3) and/or a memory device (134 in FIG. 3) that stores the historical data. In such embodiments, the MRI system 10, MRI controller 36, and/or the amp-controller 88 may retrieve $Z_{coil}$ from the historical database 130, and/or retrieve the historical data from the historical database 130 and then calculate/derive $Z_{coil}$. The historical data may include model properties of a model gradient coil, e.g., a gradient impedance factor that describes the electrical impedance of the model gradient coil, which can be used to estimate/predict/model the actual properties, e.g., actual gradient impedance, of the one or more gradient coils 46 of the MRI system 10. The model properties may be constant values and/or equations/relationships derived from experimental data collected prior to the MRI scan.

Further, some embodiments may not include the historical database 130. In such embodiments, $Z_{coil}$ may be derived/based at least in part on historical data generated by first determining the impedance empirically in one or more coils 54, and then hard coding corresponding parameters into a host software modeling application that may execute on one or more of the processors 28, 40, 96.

Accordingly, predicting 124 the gradient voltage required to drive the gradient coil 54 for a scan based at least in part on a gradient coil model $Z_{coil}$ may include calculating 136 a voltage waveform $V_{coil}$ based at least in part on a representative coil current waveform $I_{coil}$ and the gradient coil model $Z_{coil}$. In such embodiments, predicting 124 the gradient voltage may further include calculating 138 a maximum voltage $V_{MAX}$ based at least in part on the calculated voltage waveform $V_{coil}$, e.g., $V_{MAX}=\max(V_{coil})$.

As will be appreciated, due to voltage drops occurring within the gradient driver 84, to include the power supply 86, the amplifier 46, and associated cabling, calculating 126 the voltage set point from the predicted gradient voltage may include adjusting 140 the calculated maximum voltage based at least in part on a compensation voltage $V_{COMPENSATION}$, e.g., $V_{set\ point}=V_{MAX}+V_{COMPENSATION}$. In embodiments, $V_{COMPENSATION}$ may also be configured to correct for operator errors and/or errors resulting from poor calibration of the MRI controller 36, the amp-controller 88, and/or the gradient coil model $Z_{coil}$.

As will be appreciated, the MRI system 10 may execute 142 multiple scans as indicated by decision box 144. As stated above, however, $I_{coil}$ may be specific for a given PSD 102/scan. Thus, in embodiments, the method 122 may further include updating/changing 146 $I_{coil}$ and predicting 124 a subsequent gradient voltage required to drive the gradient coil 54, or a different gradient coil, for the same and/or a subsequent scan. As such, in embodiments, the amp-controller 88 may determine 148 that $I_{coil}$ should be changed/updated 146 during execution 142 of the scan, and/or determine 150 that $I_{coil}$ should be changed/updated 146 between subsequent scans.

Finally, it is also to be understood that the MRI system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the MRI system 10 may include at least one processor 28, 40, 96, 132 and system memory/data storage structures 30, 72, 98, 134 which may include random access memory (RAM) and read-only memory (ROM). The at least one processor 28, 40, 96, 132 of the MRI system 10 may include one or more conventional microprocessors and one or more supplementary co-processors such as math co-processors or the like. The data storage structures, such as memories 30, 72, 98, 134, discussed herein may include an appropriate combination of magnetic, optical and/or semiconductor memory, and may include, for example, RAM, ROM, flash drive, an optical disc such as a compact disc and/or a hard disk or drive.

The instructions of the gradient driver application may be read into a main memory of the processor 28, 40, 96, 132 from a computer-readable medium. The term "computer-readable medium", as used herein, refers to any medium that provides or participates in providing instructions to the processor 28, 40, 96, 132 of the MRI system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the gradient driver application causes the at least one processor to perform the process steps described herein, hard-wired circuitry may be used in place of, or in combination with, software instructions for implementation of the processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a method for supplying electrical power to a gradient amplifier that drives a gradient coil for a magnetic resonance imaging system is provided. The method includes predicting a gradient voltage required to drive the gradient coil for a scan based at least in part on a gradient coil model. The method further includes calculating a voltage set point for a power supply based at least in part on the predicted gradient voltage. The method further includes providing electrical power to the gradient amplifier via the power supply based at least in part on the calculated voltage set point. The gradient coil model is based at least in part on historical data acquired prior to the scan. In certain embodiments, predicting a gradient voltage required to drive the gradient coil for a scan based at least in part on a gradient model includes calculating a voltage waveform based at least in part on a representative coil current waveform and the gradient coil model. In certain embodiments, the method further includes changing the representative coil current waveform; and predicting a subsequent gradient voltage required to drive the gradient coil for a subsequent scan. In certain embodiments, predicting a gradient voltage required to drive the gradient coil for a scan based at least in part on a gradient coil model further includes calculating a maximum voltage based at least in part on the calculated voltage waveform. In certain embodiments, calculating a voltage set point for a power supply based at least in part on the predicted gradient voltage includes adjusting the calculated maximum voltage based as least in part on a compensation voltage. In certain embodiments, providing electrical power to the gradient amplifier via the power supply based at least in part on the calculated voltage set point occurs prior to a beginning of the scan. In certain embodiments, the gradient coil model is based at least in part on a gradient coil impedance factor.

Other embodiments provide for a gradient driver for a magnetic resonance imaging system. The gradient driver includes a gradient amplifier and a controller. The gradient amplifier is configured to drive a gradient coil in the magnetic resonance imaging system. The controller is configured to electronically communicate with a power supply that provides electrical power to the gradient amplifier based at least in part on a voltage set point, and to calculate the voltage set point based at least in part on a gradient voltage required to drive the gradient coil for a scan. The controller is further configured to predict the gradient voltage based at least in part on a gradient coil model derived from historical data. In certain embodiments, the predicted gradient voltage is based at least in part on a voltage waveform calculated by the controller based at least in part on a representative coil current waveform and the gradient coil model. In certain embodiments, the controller changes the representative coil current waveform, and predicts a subsequent gradient voltage required to drive the gradient coil for a subsequent scan. In certain embodiments, the predicted gradient voltage is further based at least in part on a maximum voltage calculated by the controller based at least in part on the calculated voltage waveform. In certain embodiments, the controller calculates the voltage set point by adjusting the calculated maximum voltage based at least in part on a compensation voltage. In certain embodiments, the power supply is configured to provide electrical power to the gradient amplifier based at least in part on the voltage set point prior to a beginning of the scan. In certain embodiments, the gradient coil model is based at least in part on a gradient coil impedance factor.

Yet still other embodiments provide for a magnetic resonance imaging system. The magnetic resonance imaging system includes a magnet assembly, a gradient amplifier, a power supply, and an MRI controller. The magnet assembly includes a gradient coil. The gradient amplifier is configured to drive the gradient coil. The power supply is configured to provide electrical power to the gradient amplifier based at least in part on a voltage set point. The MRI controller is configured to electronically communicate with the power supply and to calculate the voltage set point based at least in part on a gradient voltage required to drive the gradient coil for a scan. The MRI controller is further configured to predict the gradient voltage based at least in part on a gradient coil model derived from historical data. In certain embodiments, the MRI controller predicts the gradient voltage via calculating a maximum voltage from a voltage waveform derived by applying the gradient coil model to a representative coil current waveform. In certain embodiments, the MRI controller calculates a subsequent voltage set point via predicting a subsequent gradient voltage required to drive the gradient coil for a subsequent scan by applying the gradient coil model to a subsequent representative coil current waveform corresponding to the subsequent scan. In certain embodiments, the MRI controller changes the representative coil current waveform and calculates a subsequent voltage set point via predicting a subsequent gradient voltage during the scan. In certain embodiments, the MRI controller adjusts the calculated maximum voltage based at least in part on a compensation voltage. In certain embodiments, the gradient coil model is based at least in part on a gradient impedance factor.

Accordingly, by utilizing a gradient model derived from historical data to predict the gradient voltage required to drive a gradient coil for a scan, the power supply of some embodiments of the invention only needs to provide the minimal amount of power, i.e., the magnitude of the power input voltage, required for the specified scan. As stated above, the magnitude of the switching losses of the switches included in the gradient amplifiers are proportional to the magnitude of the power input voltage. Thus, by proactively managing, i.e., predicting, the gradient voltage required for a specific scan, as opposed to reactively managing, i.e., not predicting, some embodiments significantly reduce the amount of power lost in the gradient amplifiers of the MRI system, and/or reduce the amount of heat generated by the gradient amplifier, when compared to traditional gradient amplifiers/drivers. For example, some embodiments may reduce switching power losses in gradient amplifier switches by as much as 10% (5% in the open-to-close transition and 5% in the close-to-open transition) when compared to traditional gradient amplifiers/drivers.

Moreover, by reducing the required magnitude of the power input voltage, some embodiments reduce the operating costs of the MRI system. Reducing the required magnitude of the power input voltage may also reduce thermal stress on the gradient amplifier switches, and/or increase the resolution (volt-seconds) of the PSD. Thus, some embodiments may increase the reliability of such switches and/or may provide for increased precision of the MRI system.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted based on 35 U.S.C. § 112(f), unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A method for supplying electrical power to a gradient amplifier that drives a gradient coil for a magnetic resonance imaging system, the method comprising:
    predicting a gradient voltage required to drive the gradient coil for a scan based at least in part on a gradient coil model that is based at least in part on historical data acquired prior to the scan;
    calculating a voltage set point for a power supply based at least in part on the predicted gradient voltage; and
    providing electrical power to the gradient amplifier via the power supply based at least in part on the calculated voltage set point;
    wherein predicting the gradient voltage comprises calculating a voltage waveform based at least in part on a representative coil current waveform and the gradient coil model.

2. The method of claim 1, the method further comprising: changing the representative coil current waveform; and predicting a subsequent gradient voltage required to drive the gradient coil for a subsequent scan.

3. The method of claim 1, wherein predicting a gradient voltage required to drive the gradient coil for a scan based at least in part on a gradient coil model further comprises:
    calculating a maximum voltage based at least in part on the calculated voltage waveform.

4. The method of claim 3, wherein calculating a voltage set point for a power supply based at least in part on the predicted gradient voltage comprises:
    adjusting the calculated maximum voltage based as least in part on a compensation voltage.

5. The method of claim 1, wherein providing electrical power to the gradient amplifier via the power supply based at least in part on the calculated voltage set point occurs prior to a beginning of the scan.

6. The method of claim 1, wherein the gradient coil model is based at least in part on a gradient coil impedance factor.

7. A gradient driver for a magnetic resonance imaging system, the gradient driver comprising:
    a gradient amplifier configured to drive a gradient coil in the magnetic resonance imaging system;
    a controller configured to electronically communicate with a power supply that provides electrical power to the gradient amplifier based at least in part on a voltage set point, and to calculate the voltage set point based at least in part on a gradient voltage required to drive the gradient coil for a scan; and
    wherein the controller is further configured to predict the gradient voltage based at least in part on a voltage waveform calculated by the controller based at least in part on a representative coil waveform and a gradient coil model derived from historical data.

8. The gradient driver of claim 7, wherein the controller changes the representative coil current waveform, and predicts a subsequent gradient voltage required to drive the gradient coil for a subsequent scan.

9. The gradient driver of claim 7, wherein the predicted gradient voltage is further based at least in part on a maximum voltage calculated by the controller based at least in part on the calculated voltage waveform.

10. The gradient driver of claim 9, wherein the controller calculates the voltage set point by adjusting the calculated maximum voltage based at least in part on a compensation voltage.

11. The gradient driver of claim 7, wherein the power supply is configured to provide electrical power to the gradient amplifier based at least in part on the voltage set point prior to a beginning of the scan.

12. The gradient driver of claim 7, wherein the gradient coil model is based at least in part on a gradient coil impedance factor.

13. A magnetic resonance imaging system comprising:
    a magnet assembly that includes a gradient coil;
    a gradient amplifier configured to drive the gradient coil;
    a power supply configured to provide electrical power to the gradient amplifier based at least in part on a voltage set point;
    an MRI controller configured to electronically communicate with the power supply and to calculate the voltage set point based at least in part on a gradient voltage required to drive the gradient coil for a scan; and
    wherein the MRI controller is further configured to predict the gradient voltage via calculating a maximum voltage from a voltage waveform derived by applying a representative coil current waveform to a gradient coil model derived from historical data.

14. The magnetic resonance imaging system of claim 13, wherein the MRI controller calculates a subsequent voltage set point via predicting a subsequent gradient voltage required to drive the gradient coil for a subsequent scan by applying the gradient coil model to a subsequent representative coil current waveform corresponding to the subsequent scan.

15. The magnetic resonance imaging system of claim 13, wherein the MRI controller changes the representative coil current waveform, and calculates a subsequent voltage set point via predicting a subsequent gradient voltage during the scan.

16. The magnetic resonance imaging system of claim 13, wherein the MRI controller adjusts the calculated maximum voltage based at least in part on a compensation voltage.

17. The magnetic resonance imaging system of claim 13, wherein the gradient coil model is based at least in part on a gradient impedance factor.

* * * * *